(12) United States Patent
Wang

(10) Patent No.: US 8,717,039 B2
(45) Date of Patent: May 6, 2014

(54) ELECTROMAGNETIC GENERATING DEVICE FOR TESTING ELECTROMAGNETIC COMPATIBILITY

(75) Inventor: Cheng-Sung Wang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 494 days.

(21) Appl. No.: 13/087,381

(22) Filed: Apr. 15, 2011

(65) Prior Publication Data

US 2012/0217979 A1    Aug. 30, 2012

(30) Foreign Application Priority Data

Feb. 24, 2011   (TW) .............................. 100106111 A

(51) Int. Cl.
*G01R 27/28* (2006.01)
(52) U.S. Cl.
USPC ........................................................ 324/612
(58) Field of Classification Search
None
See application file for complete search history.

(56) References Cited

U.S. PATENT DOCUMENTS

| | | | |
|---|---|---|---|
| 6,549,019 B2* | 4/2003 | Nielsen | 324/628 |
| 2004/0097804 A1* | 5/2004 | Sobe | 600/424 |
| 2004/0145828 A1* | 7/2004 | Im | 360/126 |

* cited by examiner

*Primary Examiner* — Melissa Koval
*Assistant Examiner* — Trung Nguyen
(74) *Attorney, Agent, or Firm* — Novak Druce Connolly Bove + Quigg LLP

(57) ABSTRACT

An electromagnetic generating device is used for testing an electromagnetic interference of electronic elements of an electronic device. The electromagnetic generating device includes a power source and a detector. The power source includes a power output. The detector includes a first magnetic guiding portion, a second guiding portion, and an electronic coil. The first magnetic guiding portion is connected to the second magnetic guiding portion. The electronic coil surrounds the second magnetic guiding portion. The electronic coil includes an input coupled to the power output of the power source, and an output being grounded.

16 Claims, 3 Drawing Sheets

ELECTROMAGNETIC GENERATING DEVICE FOR TESTING ELECTROMAGNETIC COMPATIBILITY

BACKGROUND

1. Technical Field

The disclosure relates to electromagnetic generating devices, and particularly to an electromagnetic generating device used for testing an electromagnetic compatibility.

2. Description of Related Art

Generally, before shipment, many electronic devices undergo safety test to ensure standards of quality. A typical electromagnetic compatibility (EMC) testing method is placing an electronic device in a magnetic field. If the electronic device can not pass the electromagnetic interference (EMI) test, the designer must redesign the structure of the entire electronic device, instead of changing the position of an electronic component that can not meet the EMI requirement in the electronic device. Because, the designer does not know which exact electronic component in the electronic device can not meet the EMI requirement.

Therefore, it is desired to provide an electromagnetic generating device to overcome the above-described problem.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the disclosure will now be described in detail below, with reference to the accompanying drawings.

Figure 1:
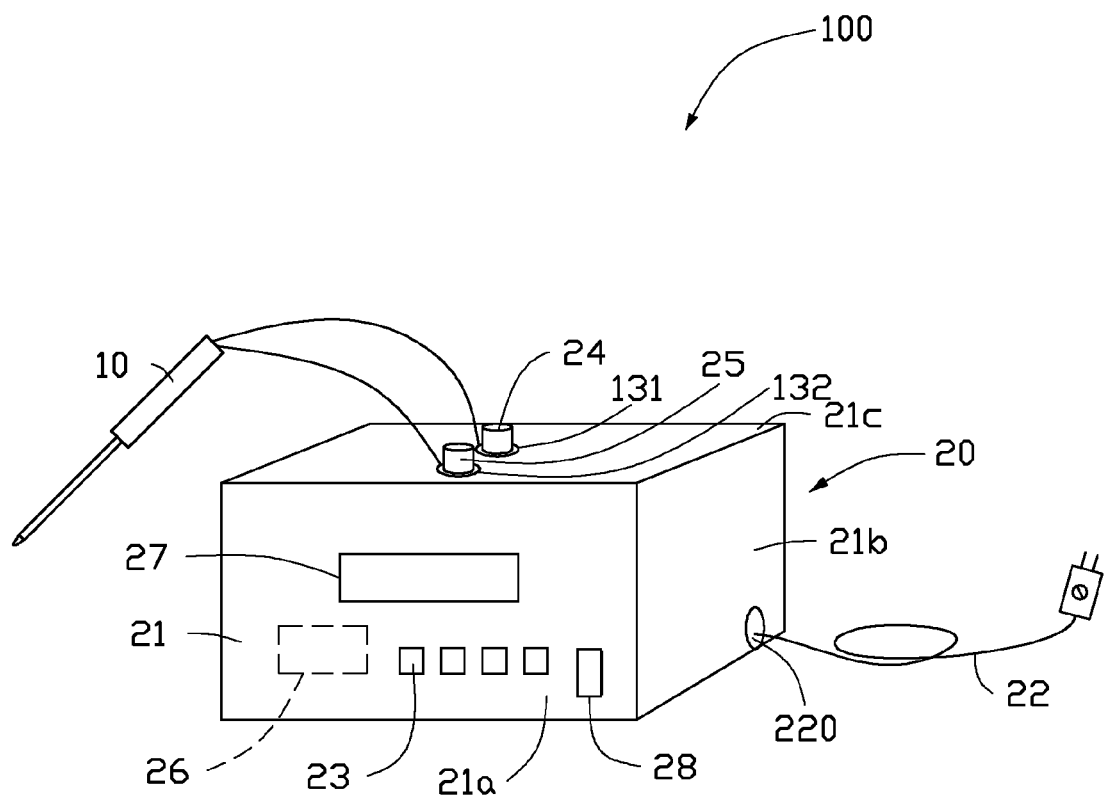
FIG. 1 is a schematic view of an electromagnetic generating device, according to an exemplary embodiment.
Figure 2:
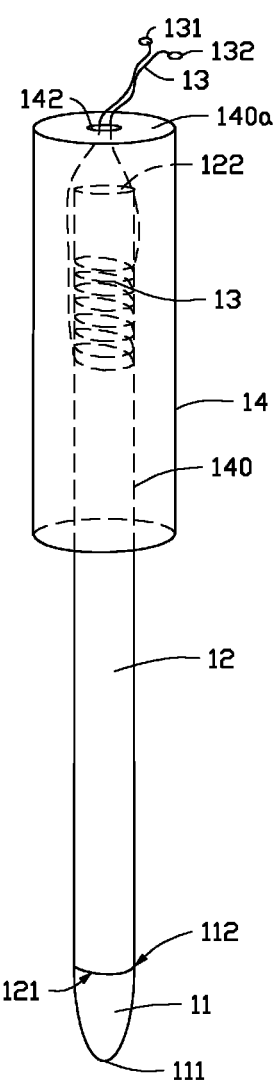
FIG. 2 is a schematic view of a detector of the electromagnetic generating device of FIG. 1.
Figure 3:
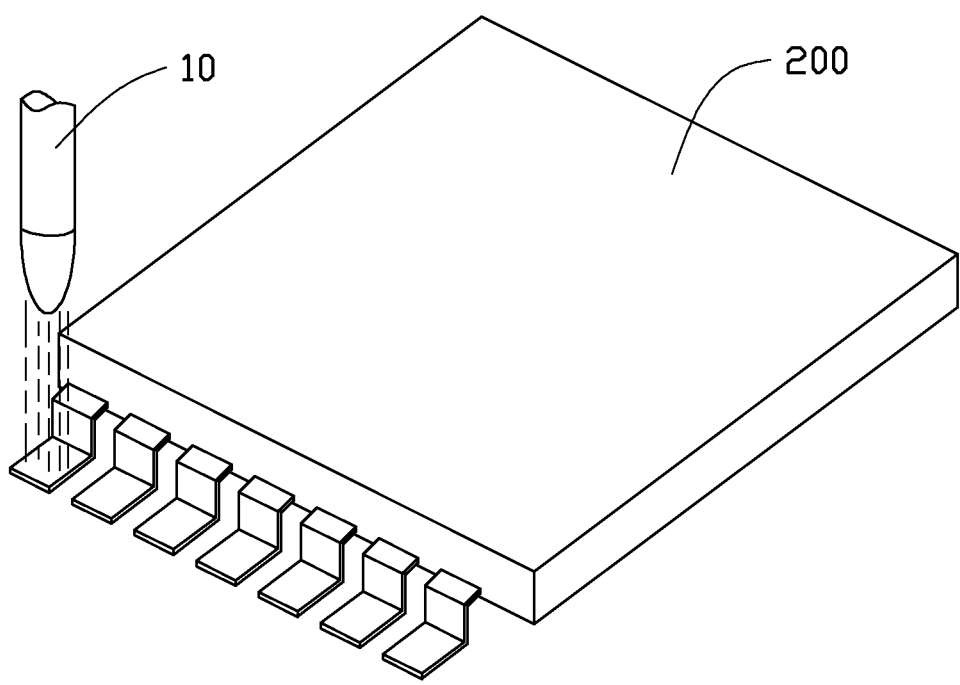
FIG. 3 is a schematic view of the detector of FIG. 2, in use.

Referring to FIGS. 1-2, an electromagnetic generating device 100, according to an exemplary embodiment, is used for providing electromagnetic field for testing electronic components 200 (as shown in FIG. 3) in an electronic device (not shown). The electromagnetic generating device 100 includes a detector 10 and a power source 20. In this embodiment, the electronic device is a computer.

The detector 10 is substantially a pen in shape and includes a first magnetic field guiding portion 11, a second magnetic field guiding portion 12, an electronic coil 13, and an insulating portion 14.

The first magnetic field guiding portion 11 is made of a magnetic field guiding material, such as Mn, Zn, and so on. The permeance factor of the first magnetic field guiding portion 11 is about 4000. In this embodiment, the first magnetic field guiding portion 11 is made of Mn. The first magnetic field guiding portion 11 includes a first connecting end 111 and a second connecting end 112 opposite to the first connecting end 111. The first connecting end 111 is substantially pyramidal in shape.

The second magnetic field guiding portion 12 is also made of a magnetic field guiding material. The permeance factor of the second magnetic field guiding portion 12 is also about 4000. In this embodiment, the second magnetic field guiding portion 12 is made of Fe. The second magnetic field guiding portion 12 includes a third connecting end 121 and a fourth connecting end 122 opposite to the third connecting end 121. The third connecting end 121 is welded on the second connecting end 112 of the first magnetic field guiding portion 11.

The electronic coil 13 surrounds around a portion of the second magnetic field guiding portion 12 close to the fourth connecting end 122, and includes an input 131 and an output 132.

The insulating portion 14 is substantially a hollow column, and defines a receiving cavity 140 therein. The shape and size of the receiving cavity 140 corresponds to that of the second magnetic field guiding portion 12. As such, the receiving part 140 is capable of wrapping the second magnetic field guiding portion 12 and receiving the electronic coil 13 therein. A top surface 140a of the insulating portion 14 defines an opening 142 communicated with the receiving cavity 140. Both the input 131 and the output 132 of the electronic coil 13 expose out of the insulating portion 14 through the opening 142.

The power source 20 includes a main body 21, a power input line 22, four output voltage adjusting buttons 23, a power output 24, a grounded end 25, and a voltage transforming circuit 26. The voltage transforming circuit 26 is received in the main body 21.

The main body 21 is substantially a hollow cuboid shell and includes a first surface 21a, a side surface 21b perpendicularly connected to an edge of the first surface 21a, and a supporting surface 21c perpendicularly connected to the first surface 21a and the side surface 21b. The side surface 21b defines a first opening 220 thereon.

One end of the power input line 22 is used for being electrically coupled to a main power supply, and the other end thereof is electrically coupled to the voltage transforming circuit 26 through the first opening 220.

The four output voltage adjusting buttons 23 are positioned on the first surface 21a and respectively coupled to the voltage transforming circuit 26. The four output voltage adjusting buttons 23 are arranged in a line. Each output voltage adjusting button 23 denotes that the voltage transforming circuit 26 outputs a different output voltage such as, 3V, 5V, 10V, and 12V voltage.

Both the power output 24 and the grounded end 25 are positioned on the supporting surface 21c with one end of the power output 24 being electrically coupled to the voltage transforming circuit 26, and the other end of the power output 24 being electrically coupled to the input 131 of the electronic coil 13. The grounded end 25 is electrically coupled to the output 132 of the electronic coil 13.

In this embodiment, the voltage transforming circuit 26 is a transformer and configured for adjusting output voltage based on which voltage adjusting button 23 is pressed. In particular, when one output voltage adjusting button 23 denoting that the voltage transforming circuit 26 outputs 3V voltage is pressed, the voltage transforming circuit 26 converts the main power supply into 3V voltage and outputs to the input 131 of the electronic coil 13 through the power output 24.

In this embodiment, the power source 20 further includes a liquid crystal display (LCD) panel 27 and a power switch 28 both mounted on the first surface 21a. The LCD panel 27 is configured for displaying the output voltage output by the voltage transforming circuit 26. The power switch 28 is configured for controlling the power source 20.

Also referring to FIG. 3, when the electromagnetic generating device 100 is used for testing the electromagnetic compatibility of an electronic component 200 in a computer (not shown), the computer is turned on and the power switch 28 turns the power source 20 on, the first connecting end 111 of the first magnetic field guiding portion 11 is aligned with the electronic component 200. Then, one of the output voltage adjusting buttons 23 is pressed, such as, the 5V output voltage adjusting button 23 is pressed, the voltage transforming circuit 26 outputs 3V voltage to the electronic coil 13 through the input 131 and the power output 24. Then, the electronic coil 13 generates a magnetic field. The magnetic field generated by the electronic coil 13 is guided to the electronic component 200 through the second magnetic field guiding portion 12 and the first magnetic field guiding portion 11. A tester hears whether the computer emits "Chi, Chi, Chi" sound or not, or views whether the screen of the computer displays "snow" or not. When the computer emits "Chi, Chi, Chi" sound or the screen of the computer displays "snow", it means that the electronic component 200 can not meet the EMI requirement, the location of the electronic component 200 is required to be changed.

The number and the arrangement of the output voltage adjusting buttons 23 on the first surface 21 are not limited to this embodiment but can be set depending on demands. The grounded end 25 can be omitted, and the output 132 of the electronic coil 13 is directly grounded.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope of the appended claims.

What is claimed is:

1. An electromagnetic generating device for testing electromagnetic compatibility, comprising:
    a power source comprising a power output; and
    a detector comprising a first magnetic guiding portion, a second guiding portion, and an electronic coil, the first magnetic guiding portion being connected to the second magnetic guiding portion, the electronic coil surrounding the second magnetic guiding portion and comprising an input and an output, the input being coupled to the power output of the power source, the output being grounded, wherein the first magnetic field guiding portion comprises a first connecting end and a second connecting end opposite to the first connecting end, the second magnetic field guiding portion comprises a third connecting end and a fourth connecting end opposite to the third connecting end, the third connecting end is connected to the second connecting end, the electronic coil surrounds the second magnetic field guiding portion and is close to the fourth connecting end.

2. The electromagnetic generating device of claim 1, wherein the permeance factor of the first magnetic field guiding portion is about 4000.

3. The electromagnetic generating device of claim 2, wherein the first magnetic field guiding portion is comprised of a material selected from the group consisting of manganese and zinc.

4. The electromagnetic generating device of claim 1, wherein the permeance factor of the second magnetic field guiding portion is about 4000.

5. The electromagnetic generating device of claim 4, wherein the second magnetic field guiding portion is comprised of iron.

6. The electromagnetic generating device of claim 1, wherein the first connecting end is substantially pyramidal-shaped.

7. The electromagnetic generating device of claim 1, wherein the detector further comprises an insulating portion, the insulating portion is substantially a hollow column and defines a receiving cavity, the receiving cavity receives the second magnetic field guiding portion and the electronic coil.

8. The electromagnetic generating device of claim 7, wherein the insulating portion comprises a top surface and defines an opening in the top surface, the opening is communicated with the receiving cavity, both the input and the output of the electronic coil expose out of the insulating portion through the opening.

9. The electromagnetic generating device of claim 1, wherein the power source further comprises a main body, a power input line, and a voltage transforming circuit received in the main body, one end of the power input line is configured for being electrically coupled to a main power supply and the other end of the power input line is electrically coupled to the voltage transforming circuit, the voltage transforming circuit is configured for converting the voltage of the main power supply into a preset voltage.

10. The electromagnetic generating device of claim 9, wherein the main body comprises a plurality of output voltage adjusting buttons respectively coupled to the voltage transforming circuit, each output voltage adjusting button is configured for controlling the voltage transforming circuit to output a different output voltage.

11. The electromagnetic generating device of claim 9, wherein the voltage transforming circuit comprises a transformer.

12. The electromagnetic generating device of claim 9, wherein the power source further comprises a liquid crystal display panel configured for displaying the output voltage output by the voltage transforming circuit.

13. The electromagnetic generating device of claim 1, wherein the power source further comprises a power switch, the power switch is configured for controlling the power source.

14. The electromagnetic generating device of claim 1, wherein the power source further comprises a grounded end, the output of the electronic coil is coupled to the grounded end.

15. An electromagnetic generating device for testing electromagnetic compatibility, comprising:
    a power source comprising a power output; and
    a detector comprising a first magnetic guiding portion, a second guiding portion, and an electronic coil, the first magnetic guiding portion being connected to the second magnetic guiding portion, the electronic coil surrounding the second magnetic guiding portion and comprising an input and an output, the input being coupled to the power output of the power source, the output being grounded, wherein the power source further comprises a main body, a power input line, and a voltage transforming circuit received in the main body, one end of the power input line is configured for being electrically coupled to a main power supply and the other end of the power input line is electrically coupled to the voltage transforming circuit, the voltage transforming circuit is configured for converting the voltage of the main power supply into a preset voltage.

16. An electromagnetic generating device for testing electromagnetic compatibility of an electronic component, the electromagnetic generating device comprising:
    a power source comprising a power output; and
    a detector comprising a first magnetic guiding portion, a second guiding portion, and an electronic coil, the first magnetic guiding portion being connected to the second magnetic guiding portion, the electronic coil surrounding the second magnetic guiding portion and comprising an input and an output, the input being coupled to the power output of the power source, the output being grounded, wherein the electronic coil is configured to generate a magnetic field, the magnetic field generated by the electronic coil is guided to the electronic component through the second magnetic field guiding portion and the first magnetic field guiding portion.

* * * * *